(12) United States Patent
Lee et al.

(10) Patent No.: US 8,119,254 B2
(45) Date of Patent: Feb. 21, 2012

(54) ORGANIC ELECTROLUMINESCENT DEVICES FORMED WITH RARE-EARTH METAL CONTAINING CATHODE

(75) Inventors: Shuit-Tong Lee, Yuen Long (HK);
Chun-Sing Lee, Kowloon Tong (HK);
Shiu-Lun Lai, North Point (HK);
Mei-Yee Chan, Tuen Mun (HK)

(73) Assignee: City University of Hong Kong, Kowloon (HK)

( * ) Notice: Subject to any disclaimer, the term of this patent is extended or adjusted under 35 U.S.C. 154(b) by 743 days.

(21) Appl. No.: 11/236,284

(22) Filed: Sep. 27, 2005

(65) Prior Publication Data

US 2006/0186792 A1    Aug. 24, 2006

Related U.S. Application Data

(63) Continuation-in-part of application No. 10/656,641, filed on Sep. 5, 2003, now abandoned.

(51) Int. Cl.
*H01L 51/50* (2006.01)
(52) U.S. Cl. ......... 428/690; 428/917; 313/504; 313/506
(58) Field of Classification Search ............... 313/503, 313/504, 506
See application file for complete search history.

(56) References Cited

U.S. PATENT DOCUMENTS

| | | | | |
|---|---|---|---|---|
| 4,769,292 A | * | 9/1988 | Tang et al. | 428/690 |
| 4,885,211 A | | 12/1989 | Tang et al. | |
| 5,364,654 A | * | 11/1994 | Hosokawa et al. | 427/66 |
| 5,536,949 A | * | 7/1996 | Hosokawa et al. | 257/40 |
| 6,174,613 B1 | * | 1/2001 | Antoniadis et al. | 428/690 |
| 2002/0145381 A1 | * | 10/2002 | Humbs | 313/504 |
| 2003/0082403 A1 | | 5/2003 | Lee et al. | |
| 2003/0113581 A1 | | 6/2003 | Gotou | |
| 2004/0094768 A1 | | 5/2004 | Yu et al. | |

FOREIGN PATENT DOCUMENTS

JP    6-45073 A  *  2/1994

OTHER PUBLICATIONS

Lai et al., Chemical Physics Letters, vol. 366, (2002), pp. 128-133.*
IEEE Electron Device Letter, vol., 24, No. 3, Mar. 2003, pp. 177-179.*
Machine generated translation for JP 06-045073 A, which was published Feb. 1994.*
"Organic Light-Emtting Diode (OLED) Construction:" 2 pages; Dec. 24, 2004 http://66.102.7.104/search?q=cache:NusPEktORLYJ:www.bgsu.edu/departments/chem/faculty/pavel/oled.htm.
"P-64: A Comparative Study of Metal Oxide Coated Indium-tin Oxide Anodes for Organic Light-emitting Diodes:" by Qiu et al.; Center for Display Research: Department of Electrical and Electronic Engineering: The Hong Kong University of Science and Technology; Eurodisplay 2002: pp. 631-634.
"'Electronic Paper'; Organic Light Emitting Diodes," unknown author: Dec. 21, 2004; five pages; http://komar.cs.stthomas.edu/qm425/01s/Tollefsrud2.htm.

* cited by examiner

*Primary Examiner* — Dawn L Garrett
(74) *Attorney, Agent, or Firm* — Bose McKinney & Evans LLP

(57) ABSTRACT

There are disclosed rare-earth metal containing electron-injecting electrodes which are particularly effective for use with organic LED devices used in electroluminescent structures and which may in particular be formed as transparent electrodes for use in transparent or surface emitting OLEDs.

7 Claims, 11 Drawing Sheets

ORGANIC ELECTROLUMINESCENT DEVICES FORMED WITH RARE-EARTH METAL CONTAINING CATHODE

RELATED APPLICATIONS

This application is a continuation-in-part application of U.S. patent application Ser. No. 10/656,641, filed Sep. 5, 2003, now abandoned.

FIELD OF THE INVENTION

This invention relates to rare-earth metal containing electron-injecting electrodes which are particularly effective for use with organic LED devices used in electroluminescent structures and which may in particular be formed as transparent electrodes for use in transparent or surface emitting OLEDs.

BACKGROUND OF THE INVENTION

Since the first report of high efficiency organic light-emitting devices (OLEDs), OLEDs have attracted extensive interest because of their enormous potential for applications in full-color flat panel displays. Device performance of OLEDs strongly depends on a balanced injection of holes and electrons into the emitting layer from the anode and the cathode. It is generally believed that lowering the injection barrier between the electrodes and the organic medium will facilitate effective carrier injection. Intensive effort has been expended on modifying and optimizing the cathode materials to establish efficient electron injection into the adjoining organic layer, such as using low work function metals or composites, doping cathode or organic layers, or inserting an insulating layer at the metal/organic interface.

Ultrathin lithium fluoride (LiF) with an overlaying aluminum film is a commonly used high-performance cathode, which significantly enhances electron injection by liberating the low work-function metal Li via LiF dissociation in the coexistence of Al, LiF, and tris-(8-hydroxyquinoline) aluminum ($Alq_3$). However, no noticeable dissociation or reaction between LiF/Al occurs in the absence of $Alq_3$, thus limiting its use for OLEDs employing other emissive organic materials. It is therefore highly desirable to provide a material which has a low work function and yet is applicable in a wide range of organic electronic/optoelectronic devices.

Furthermore, in a fundamental organic LED structure, organic layers in the OLEDs may be deposited on glass with transparent anodes (usually indium tin oxide, ITO) and capped by reflective metal cathodes. These kind of devices are hereinafter referred as bottom emitting (BE) OLEDs. However, for some applications (e.g. active matrix OLEDs), it is necessary to fabricate a surface-emitting (SE) OLED structure on opaque substrates (e.g. silicon based electronics driver and pixel switching elements). Thus, it is highly desirable to develop high performance and transparent cathodes that can be conveniently deposited on organic materials.

SUMMARY OF INVENTION

It is an object of the present invention to provide a transparent electron-injecting electrode for use with an organic electroluminescent (EL) device.

This object is achieved in an organic EL device containing a transparent electron-injecting electrode, the electrode comprising a rare-earth metal or its alloy formed by co-evaporation with a conductive material.

It is another object to the present invention to provide an effective electron-injecting electrode for an organic EL device.

This object is achieved in an organic EL device containing a tri-layer cathode structure, comprising:
a) a fluoride layer contacting the electroluminescent layer;
b) a rare-earth metal layer contacting the fluoride layer;
c) a conductive layer contacting the rare-earth metal layer; and
d) the thickness of the fluoride layer being selected so that the tri-layer acts as an electron injecting contact, the tri-layer providing stability against atmospheric corrosion.

BRIEF DESCRIPTION OF THE DRAWINGS

Some embodiments of the invention will now be described by way of example and with reference to the accompanying drawings, in which.

DETAILED DESCRIPTION OF THE INVENTION

Figure 1:
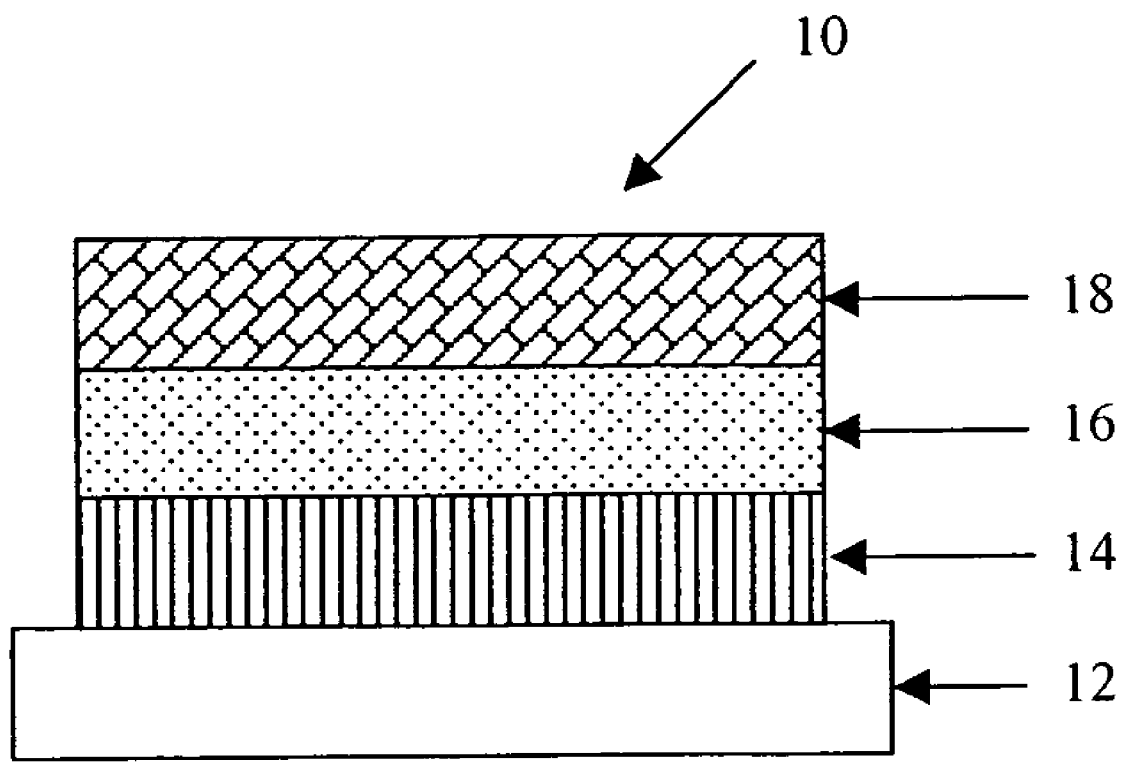
FIG. 1 is a schematic diagram of the basic structure of an organic LED.

Referring firstly to FIG. 1, an organic EL device 10 has, in order, a substrate 12, a hole-injecting anode 14, an organic layer structure 16, and an electron-injecting cathode 18.

Substrate 12 is electrically insulated and can be either optically transparent (e.g. glass or plastic foil) or opaque (e.g. semiconducting materials or ceramics). For viewing the EL emission through the substrate, or through both sides of device, a glass substrate or a plastic foil is used. For applications where the EL emission is viewed through the top electrode, opaque semiconductor and ceramic wafers can be used.

Hole-injecting anode 14 injects holes into the organic EL layer when this anode is positively biased. The anode 14 is formed of a conductive and optionally transmissive layer. If it is desired to view the EL emission through the substrate, layer 14 should be transparent. For applications where the EL emission is viewed through the top electrode, the transmissive characteristic of the layer 14 is immaterial, and therefore any appropriate materials such as metals or metal compounds having a work function greater than 4.1 eV can be used. Possible metals include gold, iridium, molybdenum, palladium, and platinum. If the anode should be transmissive, suitable materials can be selected from the group of metal oxides, including indium-tin oxide, aluminum- or indium-doped zinc oxide, tin oxide, magnesium-indium oxide, nickel-tungsten oxide, and cadmium-tin oxide. The desired metals and metal oxides can be deposited by evaporation, sputtering, laser ablation, and chemical vapor deposition.

Organic layer structure 16 either has a single layer acting as a light emitter or may be a multilayer structure, including a light emitter and carrier confinement layers. For instance, a useful structure includes a diamine layer and an undoped or doped Alq layer, as described in U.S. Pat. Nos. 5,294,869, and 5,151,629. Other suitable materials used for light emitters include poly(9,9-dioctylfluorene) (PFO), PFO copolymers, and 9,10-di-(2-naphthyl)anthracene (DNA). Organic structure 16 can be prepared by thermal evaporation or spin-coating from a solution.

Top electron-injecting cathode 18 acts as a transmissive electron injector that injects electrons into the organic EL layer when the cathode is negatively biased. The cathode is formed of a rare-earth metal or by co-evaporation of a rare-earth metal and a conductive metal. Suitable rare-earth metals include lanthanum, cerium, praseodymium, neodymium, promethium, samarium, europium, gadolinium, terbium, dysprosium, holmium, erbium, thulium, and ytterbium. Suitable conductive metals include gold, silver, nickel, palladium, and platinum.

Figure 2:
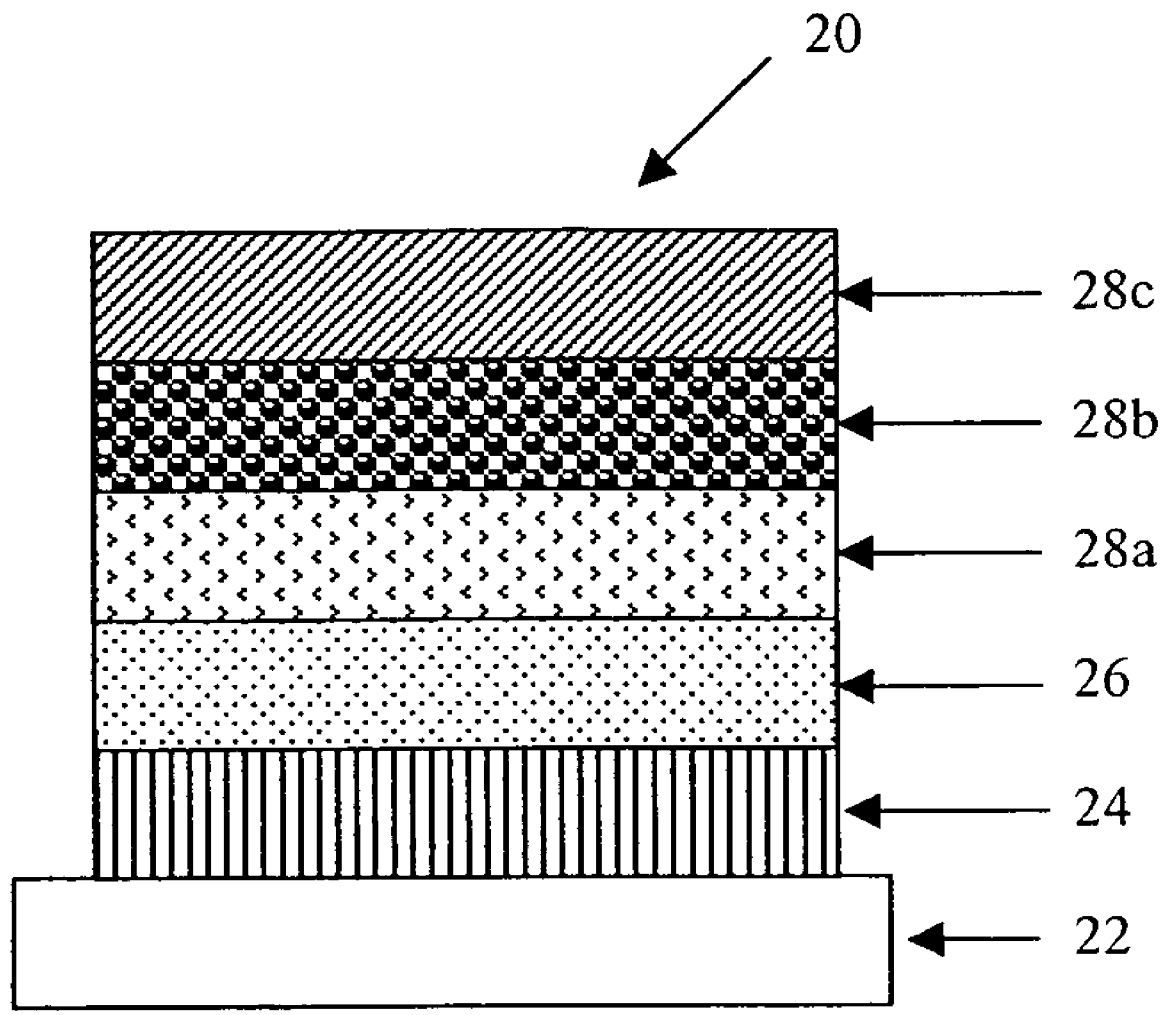
FIG. 2 is a schematic diagram of an organic LED according to an embodiment of the present invention.

Referring to FIG. 2, an organic EL device 20 according to an embodiment of the invention has, in order, a substrate, 22, a hole-injecting anode 24, an organic layer structure 26, an electron-injecting cathode 28. The top cathode includes a fluoride layer 28a, a rare-earth metal layer 28b, and a conductive overlayer 28c.

Substrate 22 is electrically insulating and can either be a bare glass substrate or plastic foil. The light transmissive property of a glass substrate or a plastic foil is desirable for viewing the EL emission through the substrate.

Hole-injecting anode 24 is either a transparent conducting oxide or a thin metal layer with sufficient optical transparency to allow light to traverse through this layer 25 and the substrate. Suitable metal oxides indium-tin oxide, aluminum- or indium-doped zinc oxide, tin oxide, magnesium-indium oxide, nickel-tungsten oxide, and cadmium-tin oxide. Suitable metals include gold, silver, nickel, palladium, and platinum.

Organic layer structure 26 either has a single layer acting as a light emitter or a multilayer structure, including a light emitter and carrier confinement layers. The composition of this layer is similar to that described for organic layer 14 in FIG. 1.

Electron-injecting cathode 28 includes a thin fluoride layer 28a, a rare-earth metal layer 28b, and a thick conductive overlayer 28c. The fluoride layer can be selected from the group of alkali fluorides and alkaline earth fluorides. The rare-earth metal layer includes lanthanum, cerium, praseodymium, neodymium, promethium, samarium, europium, gadolinium, terbium, dysprosium, holmium, erbium, thulium, and ytterbium. An effective electron injector can be formed as an ultra-thin fluoride layer that is in contact with a rare-earth metal in order to liberate very low work function metal atoms at the contact, reducing the electron injection barrier into organic medium. The conductive overlayer can be selected from the group of elemental metals, metal alloys, and other conductive materials. This conductive overlayer provides stability against atmospheric corrosion.

EXAMPLES

The following examples are presented for a further understanding of the invention. For purpose of brevity, the materials and the layers formed will be abbreviated as given below:
ITO: indium-tin oxide (anode)
NPB: α-napthylphenylbiphenyl diamine
Alq: tris-(8-hydroxyquinoline) aluminum
Yb:Ag: ytterbium:silver at a ratio of 2.5:1 by volume (cathode)

Example 1

An organic EL device according to an embodiment of the invention was constructed in the following manner.
a) a transparent anode of ITO-coated glass was ultrasonicated in a commercial detergent, rinsed in deionized water, and then dried in an oven. The substrate was further subjected to a UV-ozone treatment for 15 minutes;
b) the substrate was put into a vacuum chamber, and the chamber was pumped down to $5 \times 10^{-6}$ mbar;
c) a 72 nm thick NPB hole-transporting layer was deposited on ITO;
d) a 48 nm thick Alq emitting and electron-transporting layer was deposited on NPB layer;
e) a 37.2 nm thick Yb:Ag layer was deposited on the Alq layer. All materials were prepared by thermal evaporation from tantalum boats.

Example 2

The same materials and processing procedures were employed as described in Example 1, except that the thickness of Yb:Ag was replaced by 24.8 nm.

Example 3 corresponds to Examples 1 and 2 except that the Yb:Ag layer has a 20 thickness of 18.6 nm.

Example 4 is a device having a thicker non-transmissive cathode and has the structure ITO/NPB(72 nm)/Alq(48 nm)/Yb(14.5 nm)/Ag(200 nm).

Figure 3:
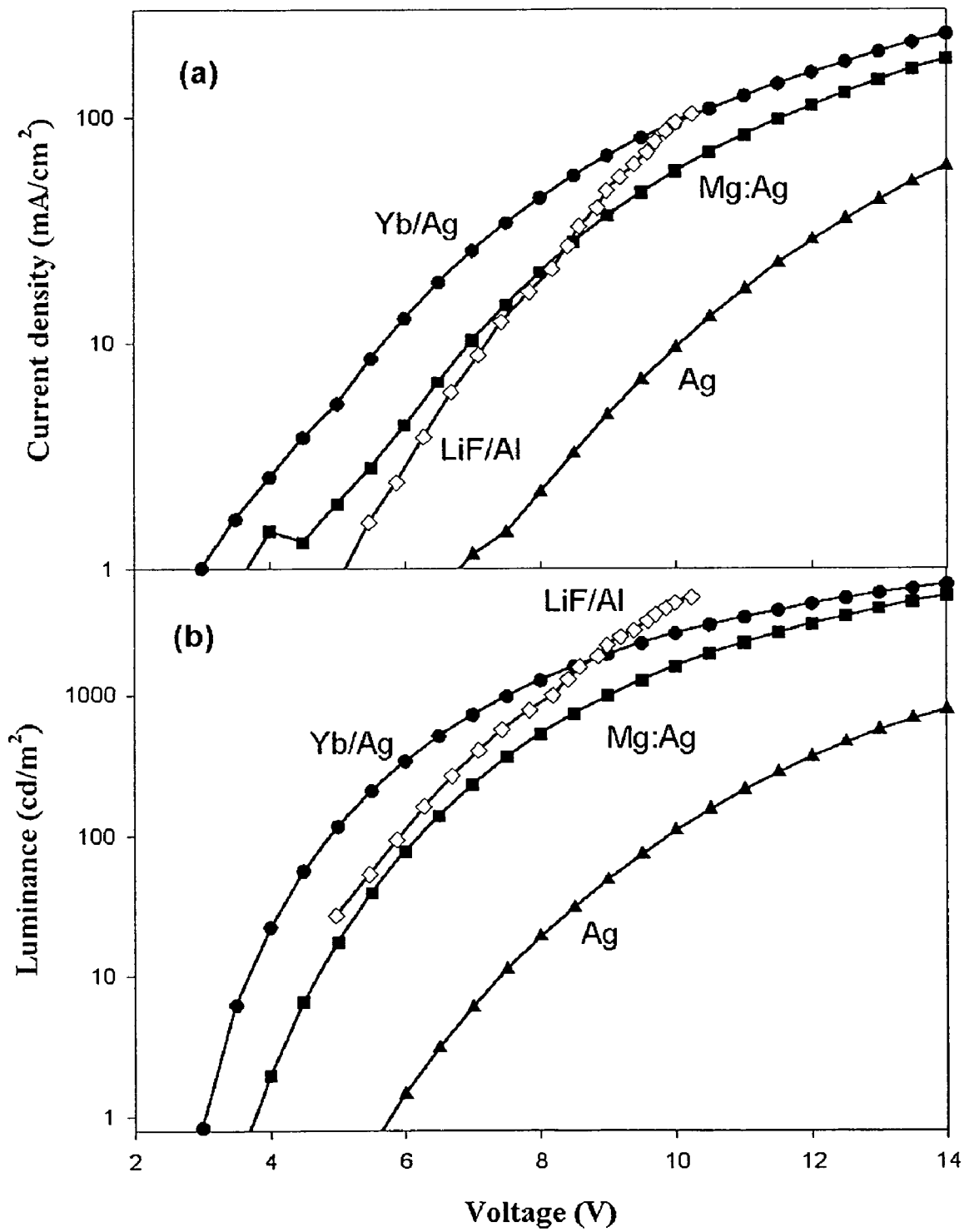
FIG. 3($a$) shows the current density as a function of operating voltage for an embodiment of the invention and examples of the prior art for comparison, FIG. 3($b$) shows the luminance as a function of operating voltage for an embodiment of the invention and examples of the prior art for comparison.

FIG. 3 shows (a) the current density and (b) the luminance of the device of Example 4 as a function of operating voltage and for comparison shows the characteristics of prior art devices formed with Mg:Ag, LiF/Al and Ag cathodes. FIGS. 3(a) and (b) clearly show the increased current density and luminance of the device of Example 4 compared with the prior art at any given operating voltage, save for LiF/Al at operating voltages above 9V.

Figure 4:
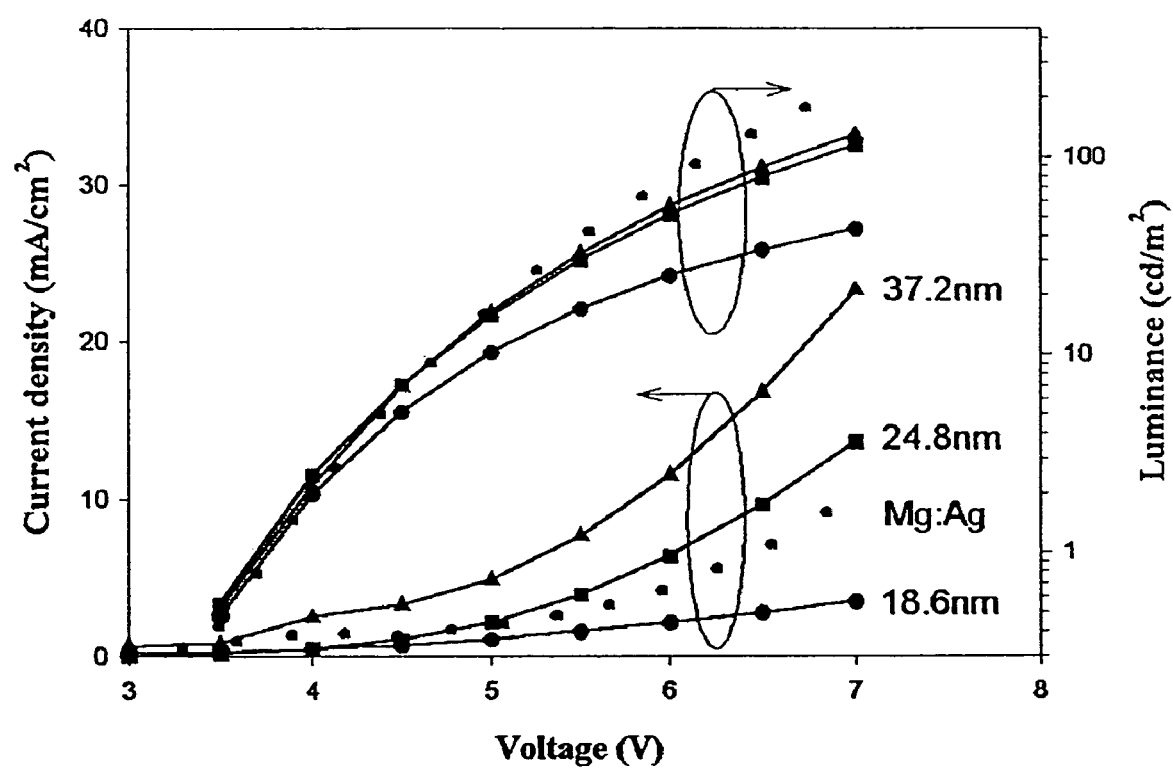
FIG. 4 shows the luminance and current density as a function of operating voltage for three embodiments of the invention with varying cathode thickness together with one example of the prior art for comparison.

Examples 1 to 3 are formed with thin transmissive cathodes and as such can be used as surface emitting (SE) devices. The electrical and optical properties of these devices are shown in FIG. 4 which plots current density (left axis) and luminance (right axis) against operating voltage for Examples 1 to 3 and also includes a prior art Mg:Ag device for comparison. For the three SE devices with a Yb:Ag cathode, the highest current density and luminance were obtained when the cathode thickness is 37.2 nm. The inventors have found that the highest current density and luminance can be obtained with cathode thicknesses of about 15 nm to about 40 nm, more preferably, about 30 nm to about 40 nm, and most preferably about 35 nm to about 40 nm. As the Yb:Ag cathode layer becomes thinner, the current density obtained also decreases. This current density decrease is most likely caused by the lower (conductance) of the thinner cathode layer. Luminance of Yb:Ag SE devices also shows a similar trend in that higher luminance can be obtained as the thickness of the Yb:Ag alloy cathode increases.

In the Yb:Ag devices without the reflecting Ag mirror (Examples 1 to 3), the OLEDs were transparent, and light can be emitted through both the top cathode surface and ITO substrate.

Figure 5:
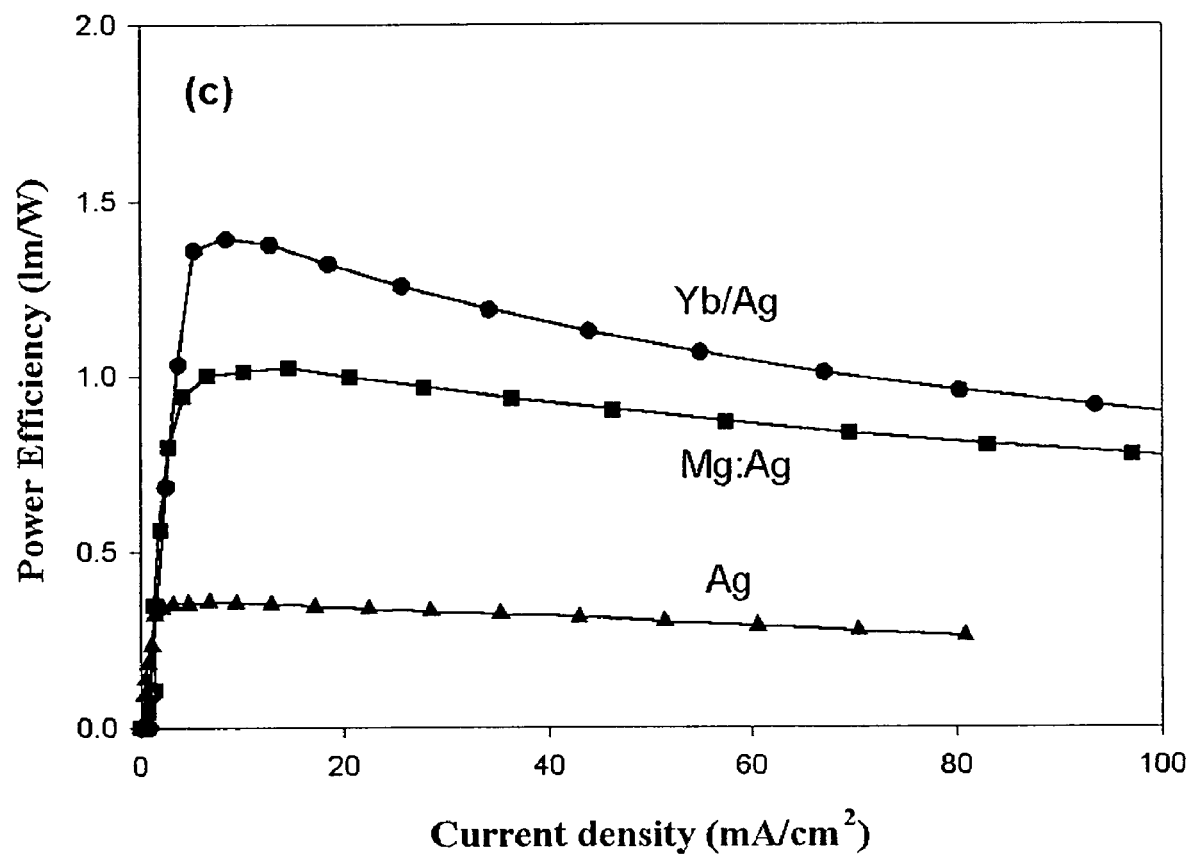
FIG. 5 is a plot showing power efficiency as a function of current density for an embodiment of the invention and two examples of the prior art for comparison, FIG. 6($a$) is a plot of current density and surface emitted luminance and total luminance at 7V as a function of cathode thickness for an embodiment of the invention, FIG. 6($b$) is a plot of current efficiency against cathode thickness for an embodiment of the invention.

FIG. 5 shows the power efficiency as a function of current density for the device of Example 4 and prior art Mg:Ag and Ag devices for comparison. FIG. 5 clearly shows the improved power efficiency of the device of Example 4.

Figure 6:
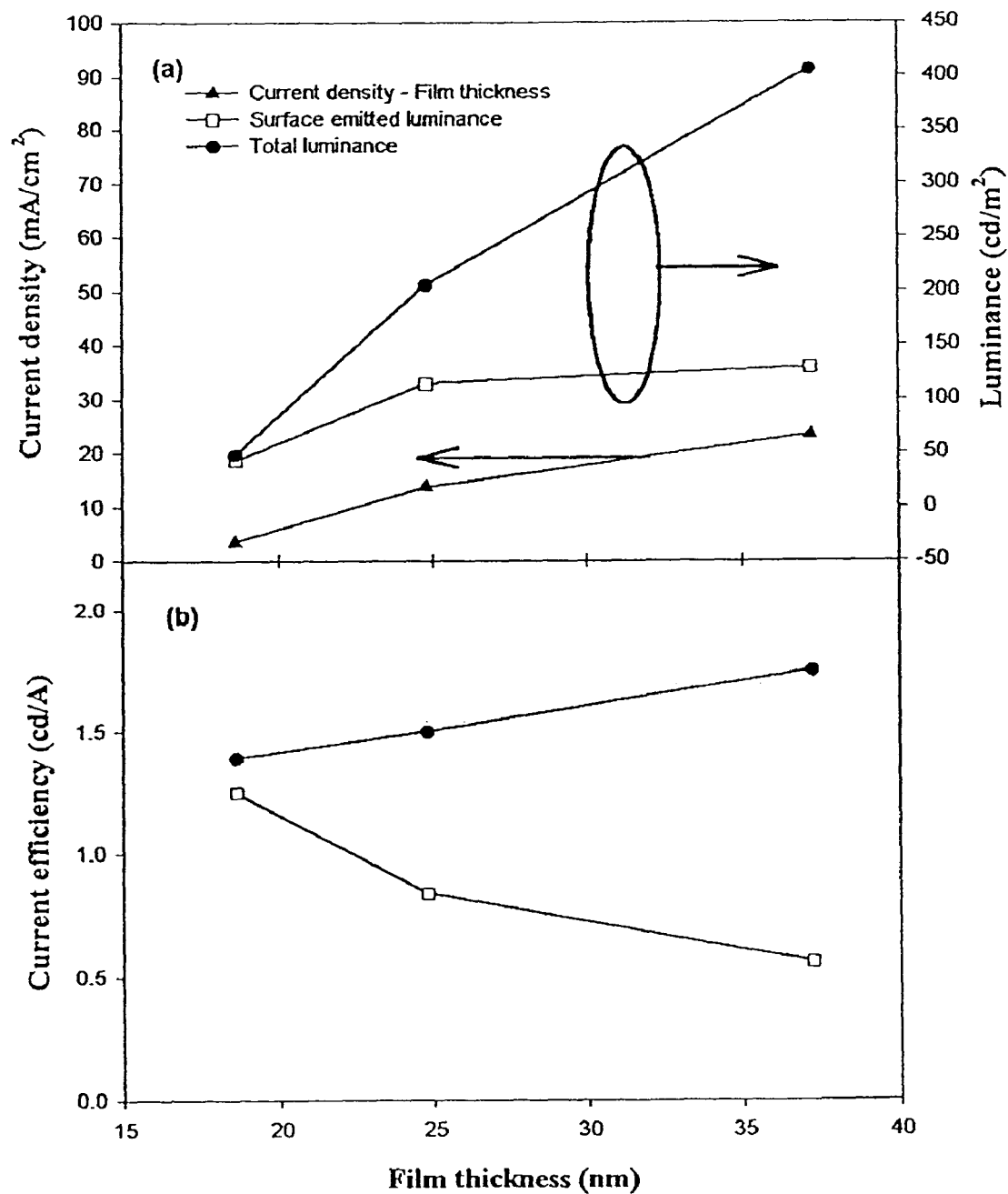

FIG. 6(a) show the surface emitted (SE) luminance, the total luminance and the current density as a function of transparent Yb:Ag cathode thickness at a driving voltage of 7V. As film thickness increases, both SE and total luminance increase with accompanying current density increases. However, while the total luminance considerably increases, the surface emission only slightly increases. This implies that a large proportion of light cannot pass through the top cathode surface and consequently is reflected backward, giving a smaller SE luminance.

FIG. 6(b) shows the current efficiency for both SE and total luminance with thickness variation. The total emitted efficiency increases as Yb:Ag film becomes thicker because of significant reduction of the resistance of Yb:Ag cathode, giving a better electron injection and contact thus higher attainable current density and luminance. However, under the same condition, the current efficiency for surface-emitting devices drops because of absorption, internal reflection of light caused by the thicker Yb:Ag layer.

Example 5 corresponds to Example 4 except that the Yb layer is replaced by other rare-earth metals, Sm, Ce and Ho.

Figure 7:
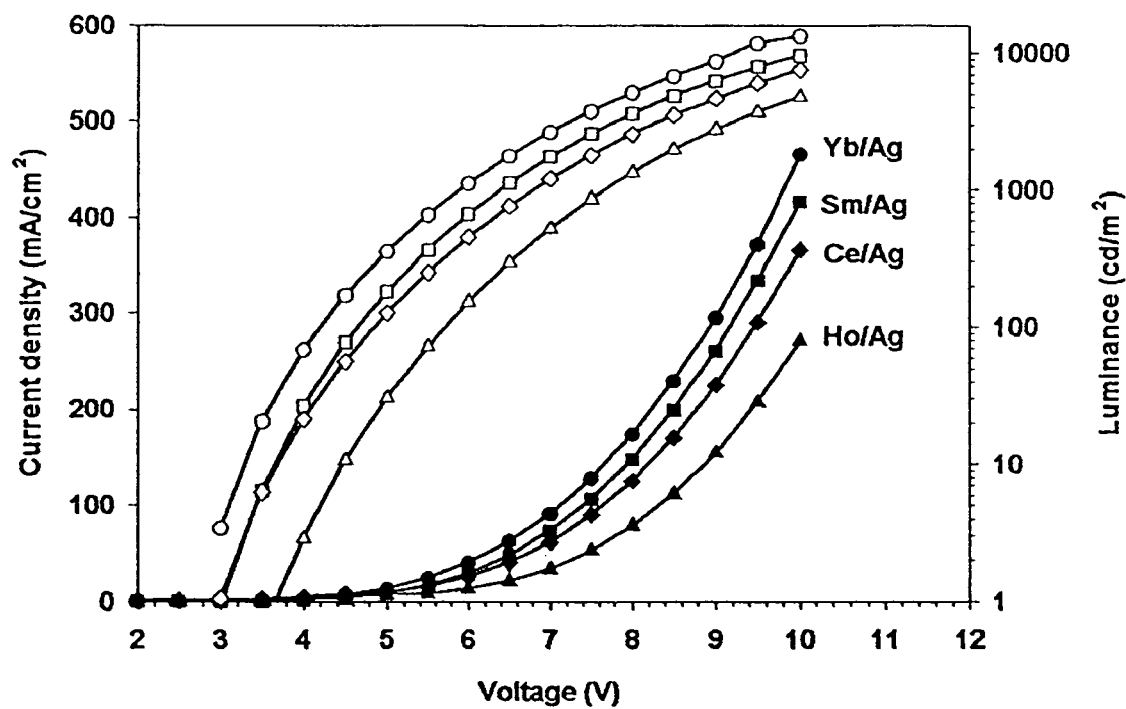
FIG. 7 is a plot showing device characteristics for other rare-earth metal cathodes.

FIG. 7 shows the device characteristics of current-voltage-light emission using different rare-earth metal cathodes. Apparently, raising the electron barrier increases the operating voltage. By replacing the Yb cathode (2.6 eV) with the high work-function rare-earth metals Sm (2.7 eV), Ce (2.9 eV) and Ho(3.1 eV), both the J-V and L-V curves shift to a higher driving voltage as predicted. This is attributed to the increase in electron injection barrier at the organic/metal interface, and therefore lower electron injection properties of the metal cathode.

Example 6

An organic EL device was constructed in the following manner:
a) an ITO-coated glass was ultrasonicated in a commercial detergent, rinsed in deionized water, and then dried in an oven. The substrate was further subjected to a UV-ozone treatment for 15 minutes;
b) the substrate was put into a vacuum chamber, and the chamber was pumped down to $5\times10^{-6}$ mbar;
c) a 72 nm thick NPB hole-transporting layer was deposited on ITO;
d) a 48 nm thick Alq emitting and electron-transporting layer was deposited on NPB layer;
e) a 1.3 nm thick cesium fluoride was deposited on the Alq layer;
f) a 14.5 nm thick ytterbium layer was deposited on the CsF layer; and
g) a 200 nm thick silver layer was deposited on the Yb layer. All materials were 10 prepared by thermal evaporation from tantalum boats.

Example 7

Prior Art

The same materials and processing procedures were employed as described in Example 6, except that the CsF/Yb/Ag trilayer was replaced by a 200 nm thick 15 Mg:Ag layer with a volume ratio of Mg:Ag=9:1.

Example 8

The same materials and processing procedures were employed as described in Example 4, except that the cesium fluoride layer was replaced by a lithium fluoride 20 layer or sodium fluoride layer.

Figure 8:
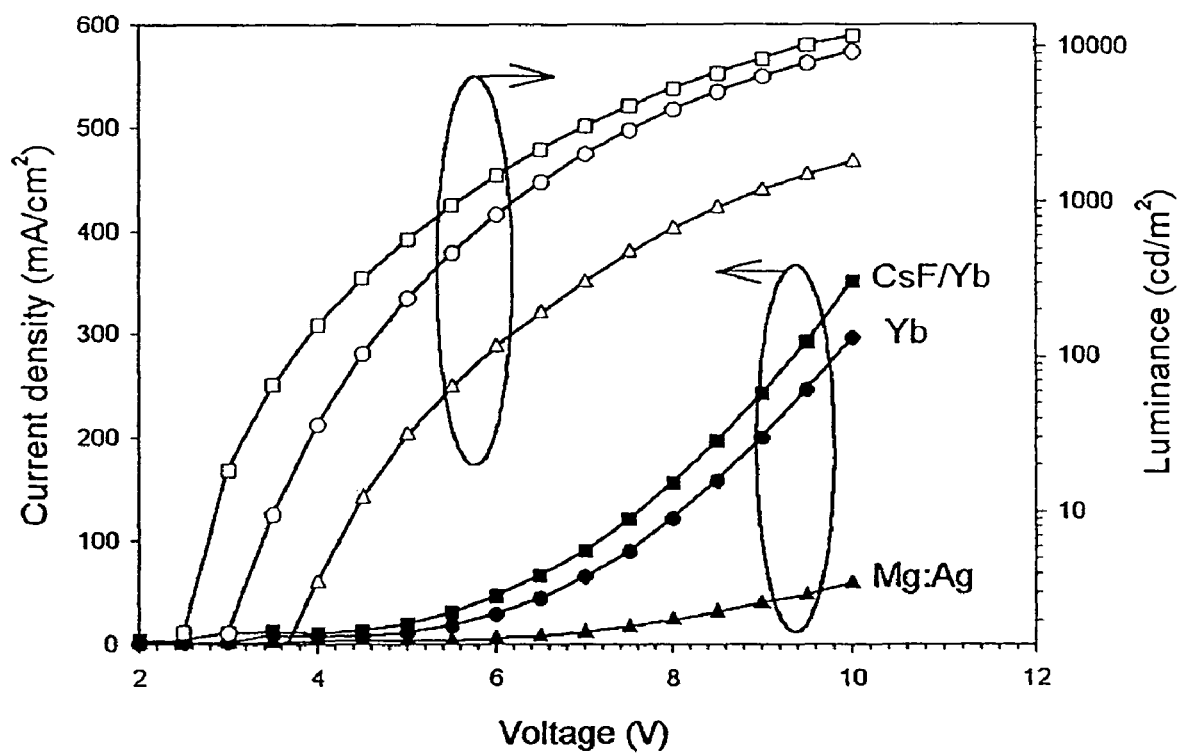
FIG. 8 shows device characteristics using a trilayer cathode in accordance with an embodiment of the invention.

The device characteristics of current-voltage-light emission are summarized in FIG. 8. Apparently, the insertion of the CsF layer significantly improves the device performance. Both J-V and L-V curves shift to a lower driving voltage. For instance, 25 the driving voltage at a current density of 100 mA/cm$^2$ of devices with the CsF/Yb, Yb, and Mg:Ag cathodes are 7.15, 7.65V and 11.7V, respectively. Similarly, the voltages to obtain a luminance of 1000 cd/m$^2$ for the three devices are 5.55, 6.20V and 8.60V, respectively. In addition, the turn-on voltage (defined as the voltage required to obtain a luminance of 1 cd/m$^2$) for the device with the CsF/Yb cathode is reduced to 2.42V, while that for Yb and Mg:Ag cathodes are at 2.95 and 3.75V respectively. Mechanisms responsible for the performance enhancement is attributed to the dissociation of CsF. This dissociation of CsF occurs spontaneously upon addition of a small amount of Yb onto it, and liberates the low work-function Cs, which dopes the electron-transporting layer and reduces the electron injection barrier; resulting in an excellent electron injecting contact.

Thus, one of skill in the art should readily recognize that these teachings provide a device having a turn-on voltage of less than about 2.90V, preferably less than about 2.5V, and, in the illustrated example, a turn-on voltage of about 2.4V. This cathode system can also be effective for almost all types of organic medium, either molecular or polymer based materials, giving a strong evidence that this dissociation is a substrate-independent process.

Example 9

The same materials and processing procedures were employed as described in Example 5, except that the devices were encapsulated. The devices were driven at a constant current density of 20 mA/cm$^2$.

Figure 9:
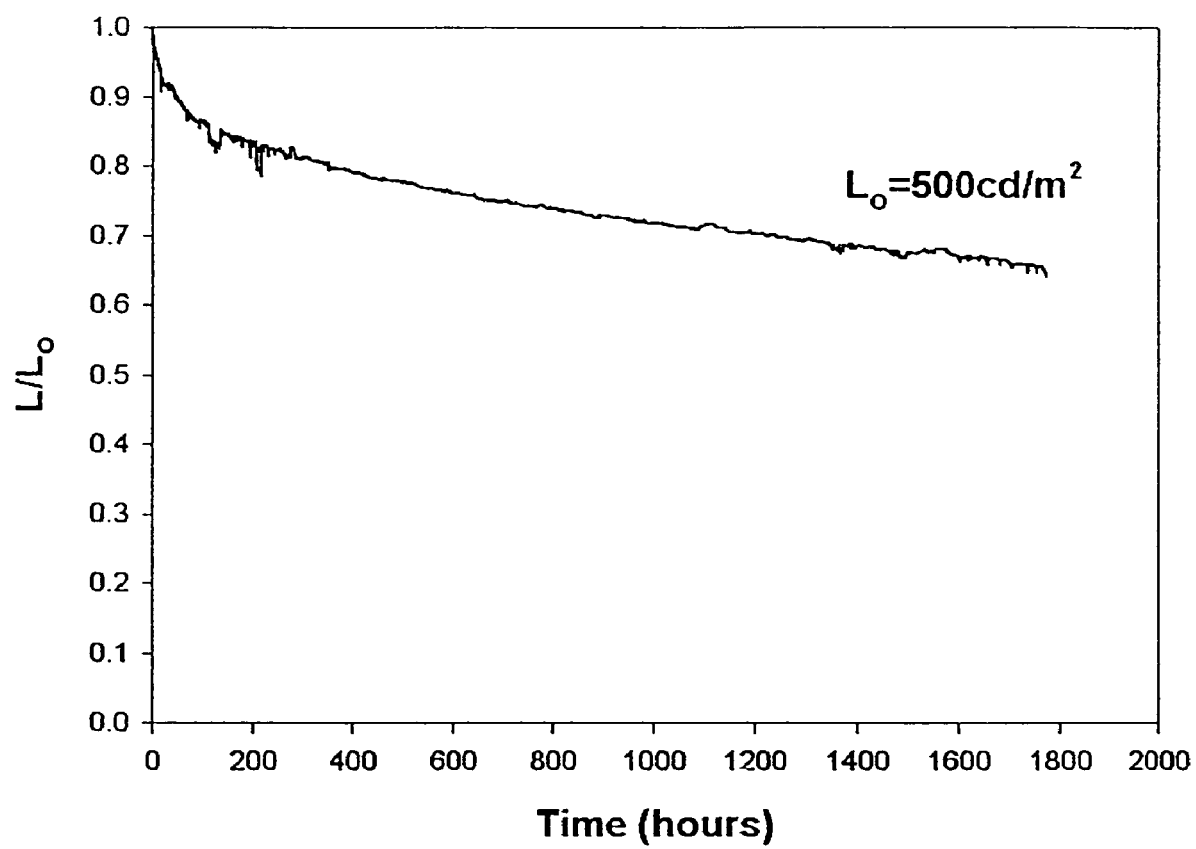
FIG. 9 is a plot of the operational stability (ie electroluminescence versus operating time) of an organic LED according to an embodiment of the present invention.

FIG. 9 exhibits the operational stability of devices with configuration of 20 NPB/Alq/CsF/Yb/Ag tested at 20 mA/cm$^2$ at room temperature. $L_0$ for the device was 500 cd/m$^2$. The luminance of presented device loses only about 26% after 800 h. The reason behind this long lifetime may be attributed to the abrupt end of oxygen diffusion at the CsF/Al interface, which significantly prolongs the degradation of devices and suppresses the growth of dark-spots, as in the case of PFO/CsF/Al or 25 Alga/LiF/Al.

Example 10

The same materials and processing procedures were employed as described in Example 6, except that the Yb layer was replaced by a Sm, Ce or Ho layer.

Figure 10:
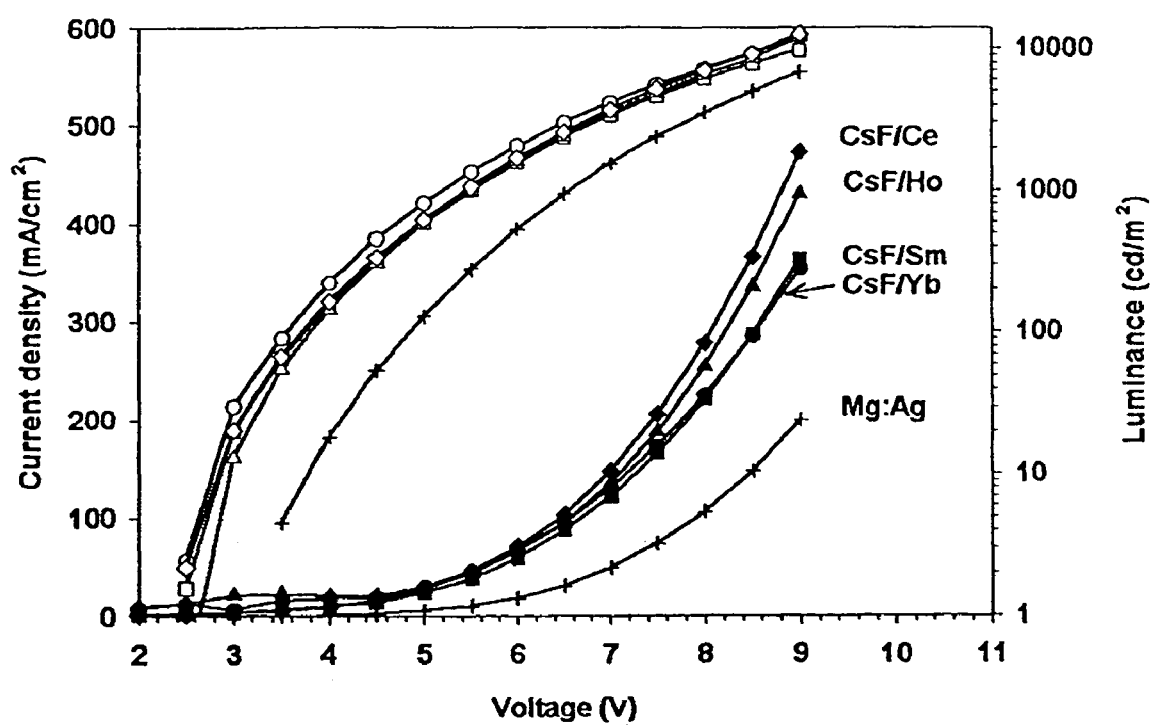
FIG. 10 is a plot of device characteristics using different trilayer structures.
Figure 11:
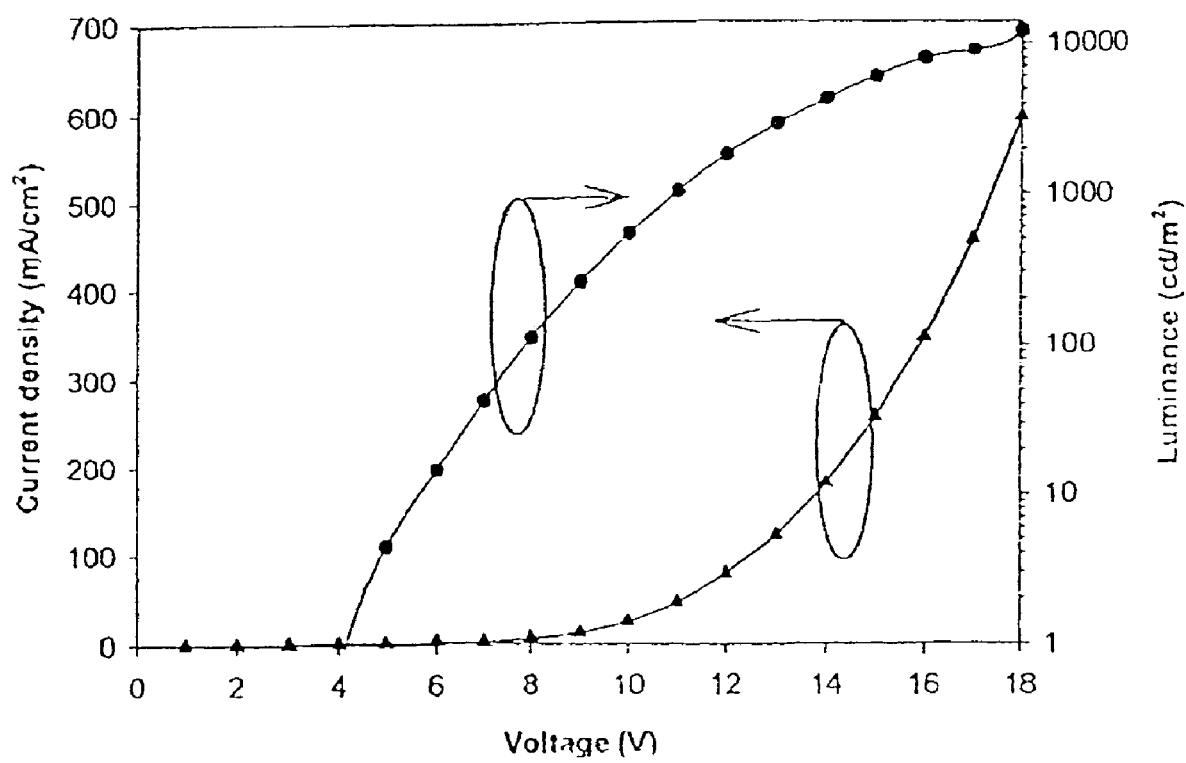
FIG. 11 is a plot of current density and luminance of a transparent cathode formed from a single rare-earth metal.

The device characteristics using different tri layer cathodes are shown in FIG. 10. Upon insertion of the CsF layer at the rare-earth metal/organic interface, the operating voltage of the devices dramatically reduces, as compared to a device with a Mg:Ag cathode. All devices using the trilayer cathode (CsF/Yb, CsF/Sm, CsF/Ho or Csf/Ce) perform almost identically with turn-on voltages of around 2.4 eV. This performance improvement is mainly attributed to the release of free Cs metal atoms at the contact, reducing the cathodic barrier. This demonstrates that the trilayer cathode structure can also be effective with the use of other rare-earth metals.

Example 11

An organic EL device according to an embodiment of the invention was constructed in the following manner.
a) a transparent ITO-coated glass was ultrasonicated in a commercial detergent, rinsed in deionized water, and then dried in an oven. The substrate was further subjected to a UV-ozone treatment for 15 minutes;
b) the substrate was put into a vacuum chamber, and the chamber was pumped down to $5 \times 10^{-6}$ mbar;
c) a 100 nm thick Ag anode layer was deposited on ITO;
d) a 72 nm thick NPD layer hole-transporting layer was deposited on the Ag layer;
e) a 48 nm thick Alq emitting and electron-transporting layer was deposited on NPB layer;
f) a 30 nm thick Yb layer was deposited on the Alq layer. All materials were prepared by thermal evaporation from tatalum boats.

The invention has been described in detail with particular reference to certain 15 preferred embodiments thereof, but it will be understood that variations and modifications can be effected within the spirit and scope of the invention.

What is claimed is:

1. An organic electroluminescent device comprising a substrate formed of an electrically insulating material, a hole-injecting anode layer, an organic electroluminescent layer, and a cathode, wherein said cathode comprises a trilayer structure, comprising:
   a CsF layer contacting the electroluminescent layer;
   a Yb layer contacting the CsF layer; and
   a conductive layer contacting the Yb layer;
   the electroluminescent device having a turn-on voltage of less than about 2.5V.
2. The electroluminescent device as claimed in claim 1, wherein said turn-on voltage is about 2.4V.
3. The electroluminescent device as claimed in claim 1, wherein said conductive layer is selected from the group consisting of elemental metals and metal alloys.
4. The electroluminescent device as claimed in claim 1, wherein said substrate is a glass substrate or a plastic foil.
5. The electroluminescent device as claimed in claim 1, wherein the anode is optically transmissive and selected from the group consisting of metal oxides including indium-tin oxide, aluminum or indium-doped zinc oxide, tin oxide, magnesium-indium oxide, nickel-tungsten oxide, and cadmium-tin oxide.
6. The electroluminescent device as claimed in claim 1, wherein said the organic electroluminescent layer is selected from the group consisting of poly(9,9-dioctylfluorene) (PFO), PFO copolymers, and 9,10-di(2-naphthyl)anthracene (DNA), or tri-(8hydroxyquinoline) aluminum (Alq.).
7. The electroluminescent device as claimed in claim 1, wherein said conductive layer is an Ag layer.

* * * * *